(12) United States Patent
Chang et al.

(10) Patent No.: US 12,253,143 B2
(45) Date of Patent: Mar. 18, 2025

(54) ACTUATING DEVICE

(71) Applicant: KOGE MICRO TECH CO., LTD., New Taipei (TW)

(72) Inventors: Chih Chang, New Taipei (TW); Po-Yuan Liao, New Taipei (TW)

(73) Assignee: KOGE MICRO TECH CO., LTD., Taipei (TW)

( * ) Notice: Subject to any disclaimer, the term of this patent is extended or adjusted under 35 U.S.C. 154(b) by 0 days.

(21) Appl. No.: 18/542,145

(22) Filed: Dec. 15, 2023

(65) Prior Publication Data
US 2024/0117862 A1    Apr. 11, 2024

Related U.S. Application Data

(63) Continuation-in-part of application No. 17/573,962, filed on Jan. 12, 2022, now abandoned.

(30) Foreign Application Priority Data

Jun. 22, 2021 (TW) ................... 110207222

(51) Int. Cl.
| | |
|---|---|
| *F16K 31/00* | (2006.01) |
| *F03G 7/06* | (2006.01) |
| *F16H 21/04* | (2006.01) |
| *H10N 30/20* | (2023.01) |

(52) U.S. Cl.
CPC .............. *F16H 21/04* (2013.01); *F03G 7/064* (2021.08); *F16K 31/006* (2013.01); *H10N 30/2042* (2023.02)

(58) Field of Classification Search
CPC ............ H10N 30/2042; H10N 30/204; H10N 30/2041; F16K 31/006; F16H 21/04; F03G 7/064
USPC ...................................... 251/129.06
See application file for complete search history.

(56) References Cited

U.S. PATENT DOCUMENTS

| | | | | |
|---|---|---|---|---|
| 2,497,108 | A | * | 2/1950 | Williams .............. H04R 17/00 29/25.35 |
| 3,168,623 | A | | 2/1965 | Petermann |
| 3,325,780 | A | * | 6/1967 | Horan ................ B06B 1/0603 367/164 |
| 3,405,289 | A | * | 10/1968 | Gikow ................ H01H 57/00 310/369 |
| 3,989,964 | A | * | 11/1976 | Gikow ................ H10N 30/20 310/317 |
| 4,492,360 | A | | 1/1985 | Lee et al. |
| 4,617,952 | A | | 10/1986 | Fujiwara et al. |
| 4,629,926 | A | | 12/1986 | Segal |
| 5,225,731 | A | * | 7/1993 | Owen ................. H10N 30/204 310/357 |
| 5,460,202 | A | | 10/1995 | Hanley et al. |
| 5,779,218 | A | | 7/1998 | Kowanz |

(Continued)

*Primary Examiner* — William M Mccalister
(74) *Attorney, Agent, or Firm* — Juan Carlos A. Marquez; Marquez IP Law Office, PLLC

(57) ABSTRACT

An actuating device includes an actuator and a stationary portion. The actuator has at least one driving portion. The stationary portion is provided at an arbitrary position along the actuator such that the driving portion forms a first driving portion and a second driving portion. The first driving portion and the second driving portion can be provided with the same actuating ability or with different actuating abilities respectively by adjusting the position of the stationary portion.

7 Claims, 5 Drawing Sheets

(56) References Cited

U.S. PATENT DOCUMENTS

| | | | |
|---|---|---|---|
| 6,173,744 B1 | 1/2001 | Frisch et al. | |
| 6,484,754 B1 | 11/2002 | Muth et al. | |
| 6,581,638 B2 | 6/2003 | Frisch et al. | |
| 6,703,761 B2 | 3/2004 | Gallmeyer et al. | |
| 7,015,624 B1 * | 3/2006 | Su | H10N 30/857 |
| | | | 310/330 |
| 7,069,795 B2 * | 7/2006 | McKevitt | H10N 30/302 |
| | | | 367/160 |
| 7,322,376 B2 | 1/2008 | Frisch | |
| 8,631,825 B2 | 1/2014 | Lee et al. | |
| 9,112,477 B2 * | 8/2015 | Bahriz | H03H 9/2452 |
| 9,423,044 B2 | 8/2016 | Im et al. | |
| 11,946,559 B2 * | 4/2024 | Chang | F16K 11/18 |
| 2002/0059957 A1 | 5/2002 | Frisch et al. | |
| 2004/0177890 A1 | 9/2004 | Weinmann et al. | |
| 2022/0406987 A1 | 12/2022 | Wu | |

\* cited by examiner

ACTUATING DEVICE

BACKGROUND OF THE INVENTION

1. Technical Field

The present invention relates to an actuating device and more particularly to an actuating device that has a plurality of driving portions and provides multi-directional drive control.

2. Description of Related Art

Recently, pressure-based flow control devices have been widely used in place of mass flow controllers in such precision manufacturing equipment as that used for semiconductor manufacturing processes. A pressure-based flow control device features high resistance to corrosion, low dust accumulation, superior gas replacement properties, and rapid opening and closing. The driving device of a pressure-based flow control device typically includes a piezoelectric element (also known as a piezoelectric actuator), which can generate a great pushing force and has a short response time and outstanding control properties.

A piezoelectric driving device uses a piezoelectric actuator to control the motion of a mechanical device. More specifically, a voltage is applied to the piezoelectric actuator in order for the piezoelectric actuator to drive the mechanical device into motion, and for the element operated by the mechanical device to start a tappet or lever motion. Nowadays, piezoelectric driving devices are used in an extensive array of industries, particularly those involving production technologies, including for example the production of electronic peripherals, biomedical engineering, the aerospace industry, automotive electronics, biotechnology, and the precision tool industry.

BRIEF SUMMARY OF THE INVENTION

The present invention relates to an actuating device in which a first driving portion and a second driving portion can be provided with the same actuating ability or each with a different actuating ability by adjusting a stationary portion in position to make a first length of the first driving portion and a second length of the second driving portion equal to or different from each other.

The actuating device of the present invention, comprises: an actuator having at least one driving portion; a stationary portion provided in a rectangular housing and at an arbitrary position along the actuator such that the driving portion forms a first driving portion on one side of the driving portion and a second driving portion on an opposite side of the driving portion, the actuating device being characterized in that by adjusting the stationary portion in position to make a first length of the first driving portion and a second length of the second driving portion equal to or different from each other, the first driving portion and the second driving portion are able to be provided with a same actuating ability or each with a different actuating ability; wherein the first driving portion is an elongated member for providing a moment arm and has a first driving end, and the second driving portion is also an elongate member for providing a moment arm and has a second driving end; a first valve controller held in the housing in a rotatable manner by a pin and having: a first force-receiving end having a side corresponding to the first driving end in order for the first force-receiving end to be driven by the first driving end; a first valve-controlling end for controlling opening and closing of a first port of the housing; and a first restoring spring provided between an opposite side of the first force-receiving end and the housing; and a second valve controller held in the housing in a rotatable manner by a pin and having: a second force-receiving end having a side corresponding to the second driving end in order for the second force-receiving end to be driven by the second driving end; a second valve-controlling end for controlling opening and closing of a second port of the housing; and a second restoring spring provided between an opposite side of the second force-receiving end and the housing.

BRIEF DESCRIPTION OF THE SEVERAL VIEWS OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE INVENTION

Figure 1:
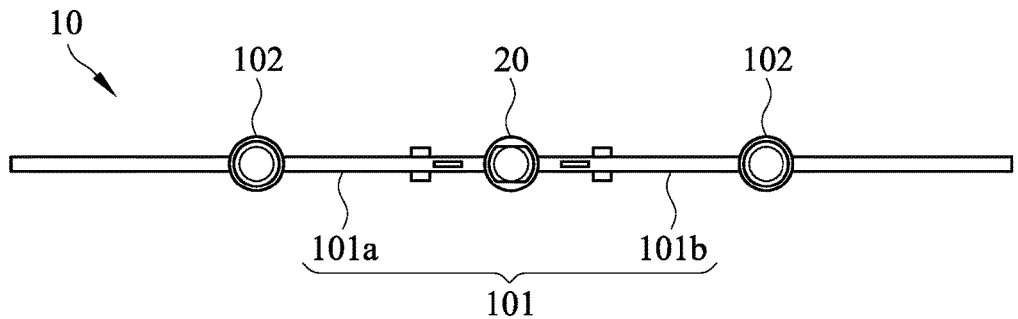
FIG. 1 is a sectional view of the actuating device according to the first embodiment of the present invention.
Figure 2:
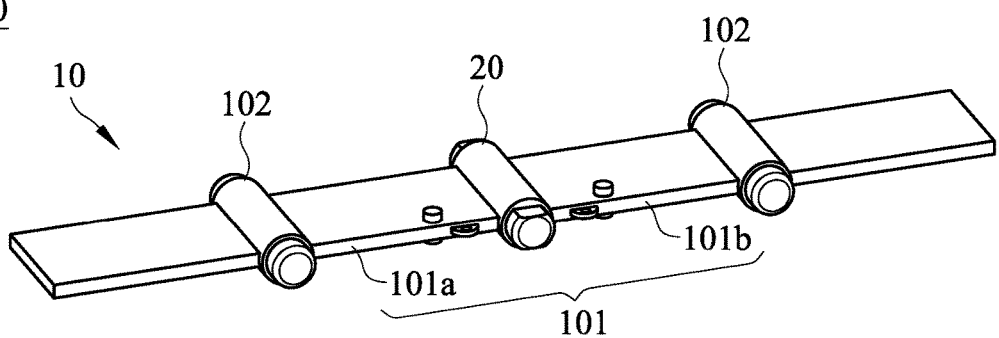
FIG. 2 is a perspective view of the actuating device according to the first embodiment of the invention.

Please refer to FIG. 1 for a sectional view of the actuating device according to the first embodiment of the present invention, and FIG. 2 for a perspective view of the actuating device according to the first embodiment of the invention. As shown in FIG. 1 and FIG. 2, the actuating device 100 in this embodiment includes an actuator 10 and a stationary portion 20. The actuator 10 has at least one driving portion 101. The stationary portion 20 is provided in a rectangular housing (30) and at an arbitrary position along the actuator 10 such that the driving portion 101 forms a first driving portion 101*a* on one side of the driving portion and a second driving portion 101*b* on an opposite side of the driving portion.

In this embodiment, with continued reference to FIG. 1 and FIG. 2, the stationary portion 20 is provided at the middle of the actuator 10 in order to form the first driving portion 101a and the second driving portion 101b. By fine-tuning the position of the stationary portion 20, the first driving portion 101a and the second driving portion 101b can be provided with the same actuating ability or with different actuating abilities respectively.

In this embodiment, with continued reference to FIG. 1 and FIG. 2, the material of the actuator 10 includes at least one intelligent material selected from the group consisting of a memory metal, a thermoelectric material, a piezoelectric material, and a thermally deformable material. The material of the actuator 10, however, is not limited to those mentioned above. Moreover, the actuator 10 includes at least one supporting member 102. If one of the first driving portion 101a and the second driving portion 101b is longer than the other after the position of the stationary portion 20 is fine-tuned, the supporting member 102 can increase the structural strength of the one of the first driving portion 101a and the second driving portion 101b so that the entire actuator 10 can be securely disposed in a valve product. The design of the supporting member 102 may vary in order to increase the structural strength of the actuator 10, thereby allowing the actuating device 100 of the present invention to have wider application in various valve products than its prior art counterparts.

Figure 3:
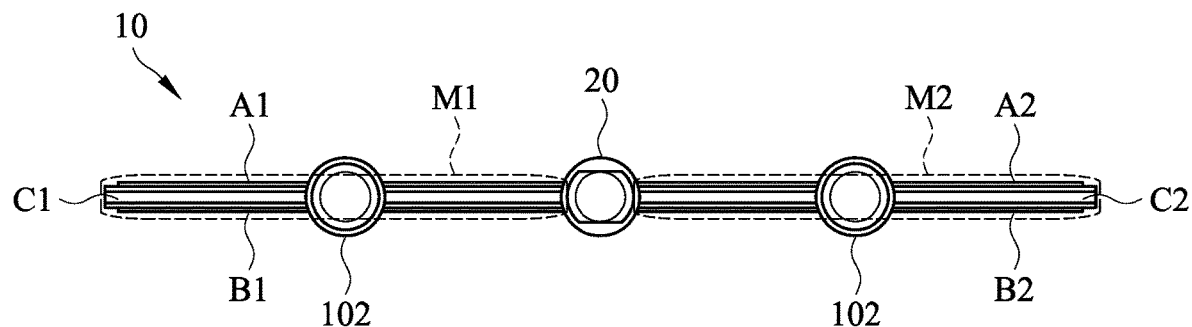
FIG. 3 shows the electrodes of the driving portion of the actuating device according to the first embodiment of the invention.

FIG. 3 shows the electrodes of the actuating device according to the first embodiment of the present invention to facilitate understanding of how the electrodes can be deformed. In this embodiment, the driving portion 101 has at least one electrode that can be driven independently. When the stationary portion 20 is provided at the middle of the actuator 10, the first driving portion 101a forms at least one first electrode, and the second driving portion 101b forms at least one second electrode, wherein the first electrode and the second electrode are electrically isolated from each other; in other words, each of the first driving portion 101a and the second driving portion 101b has at least one electrode that can be driven independently. When the actuating device 100 is operated, the first driving portion 101a can be deformed in different directions, depending on how the electric field applied to the first A electrode A1, the first B electrode B1, and the first C electrode C1 in a first actuation area M1, which corresponds to the first driving portion 101a, is controlled. By the same token, the second driving portion 101b can be deformed in different directions, depending on how the electric field applied to the second A electrode A2, the second B electrode B2, and the second C electrode C2 in a second actuation area M2, which corresponds to the second driving portion 101b, is controlled. The first A electrode A1, the first B electrode B1, the first C electrode C1, the second A electrode A2, the second B electrode B2, and the second C electrode C2 are independent, and electrically isolated, from one another, although it is feasible for the first C electrode C1 and the second C electrode C2 to either be electrically independent electrodes or be electrically connected to form a common electrode.

An actuating device 100a whose configuration is different from that of the actuating device 100 in the previous embodiment is described below. Those elements of the actuating device 100a that are respectively identical or similar to their counterparts in the previous embodiment are respectively indicated by the same or similar reference numerals and will not be described repeatedly. The following paragraphs describe only the major differences between the two embodiments.

Figure 4:
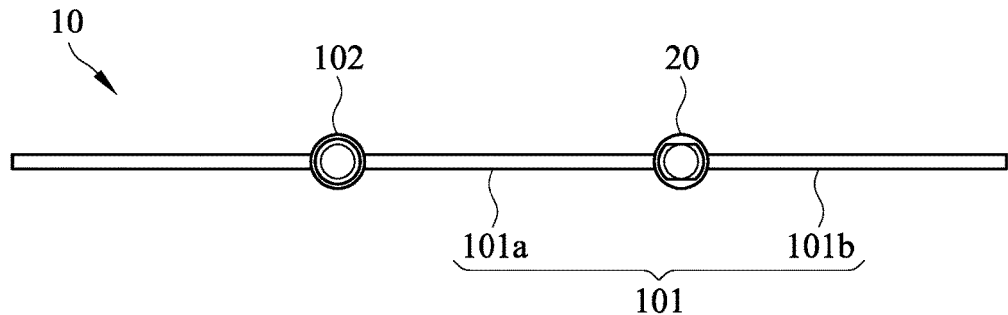
FIG. 4 is a sectional view of the actuating device according to the second embodiment of the invention.
Figure 5:
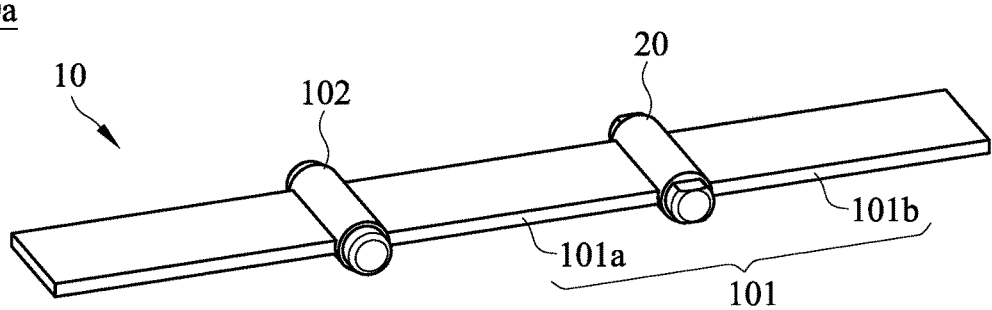
FIG. 5 is a perspective view of the actuating device according to the second embodiment of the invention.

Please refer to FIG. 4 for a sectional view of the actuating device according to the second embodiment of the present invention, and FIG. 5 for a perspective view of the actuating device according to the second embodiment of the invention. As shown in FIG. 4 and FIG. 5, the actuating device 100a in this embodiment is different from the actuating device 100 in the previous embodiment mainly in that the stationary portion 20 in the second embodiment is provided at a position that renders the first driving portion 101a of the actuator 10 longer than the second driving portion 101b. The supporting member 102, therefore, is additionally provided at the middle of the first driving portion 101a to increase the structural strength of the first driving portion 101a, whereas the relatively short second driving portion 101b is not provided with any supporting member 102. As in the previous embodiment, the position of the stationary portion 20 can be fine-tuned in order for the first driving portion 101a and the second driving portion 101b to have the same actuating ability or have different actuating abilities respectively.

Figure 6:
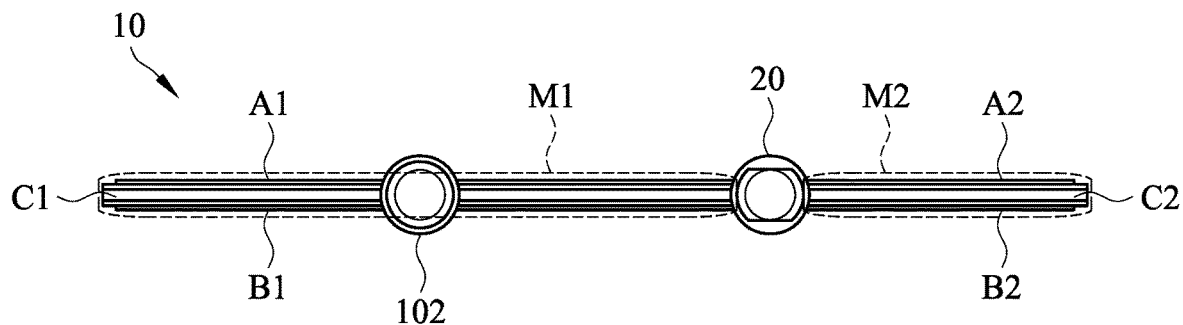
FIG. 6 shows the electrodes of the driving portion of the actuating device according to the second embodiment of the invention.

FIG. 6 shows the electrodes of the actuating device according to the second embodiment of the present invention to facilitate understanding of how the electrodes can be deformed. In this embodiment, the stationary portion 20 is provided at a position that renders the first actuation area M1 of the actuator 10 wider than the second actuation area M2. When the actuating device 100a is operated, the first driving portion 101a can be deformed in different directions, depending on how the electric field applied to the first A electrode A1, the first B electrode B1, and the first C electrode C1 in the first actuation area M1, which corresponds to the first driving portion 101a, is controlled. Similarly, the second driving portion 101b can be deformed in different directions, depending on how the electric field applied to the second A electrode A2, the second B electrode B2, and the second C electrode C2 in the second actuation area M2, which corresponds to the second driving portion 101b, is controlled. The first A electrode A1, the first B electrode B1, the first C electrode C1, the second A electrode A2, the second B electrode B2, and the second C electrode C2 are independent, and electrically isolated, from one another, although it is feasible for the first C electrode C1 and the second C electrode C2 to either be electrically independent electrodes or be electrically connected to form a common electrode.

Figure 7:
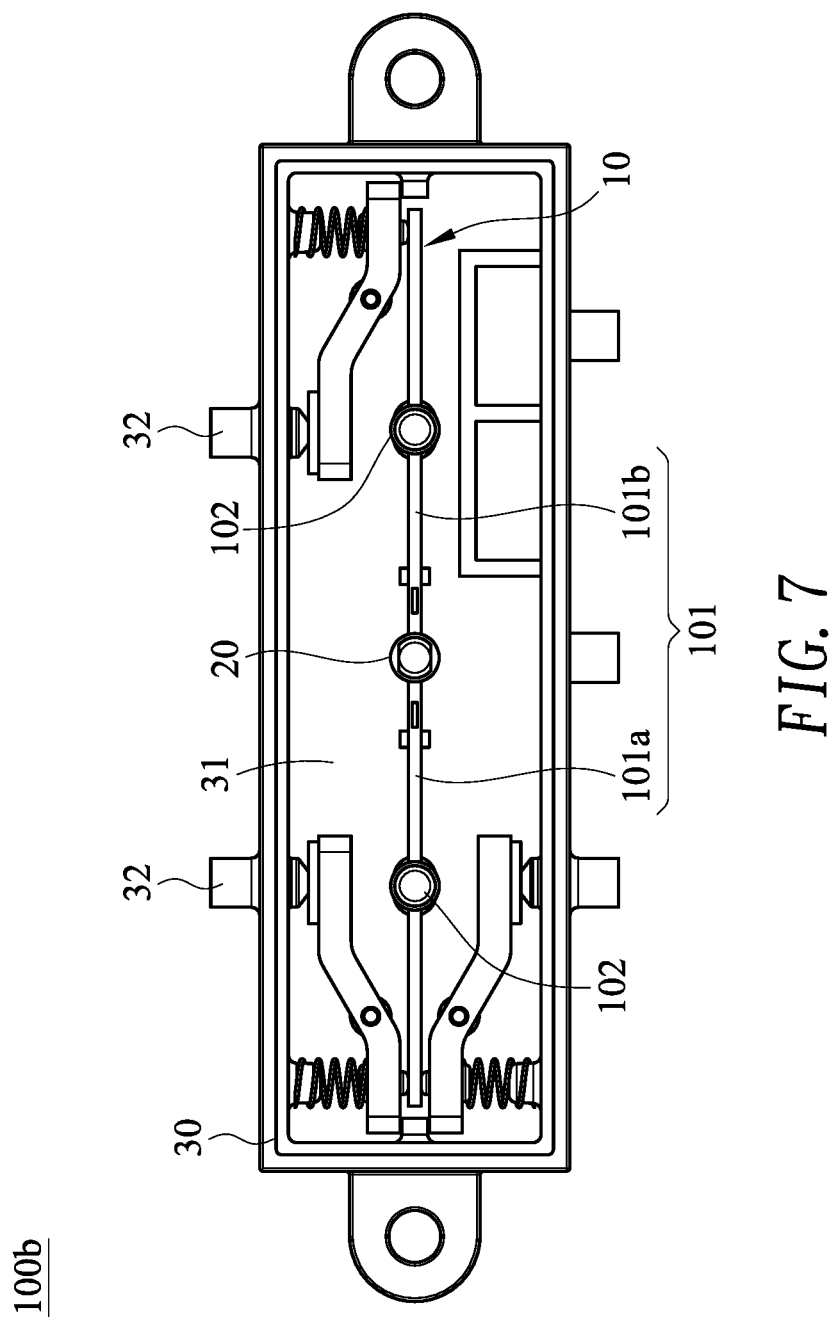
FIG. 7 is a sectional view of the actuating device according to the third embodiment of the invention, in which embodiment the actuator and the stationary portion are provided in the interior space of a housing.
Figure 8A:
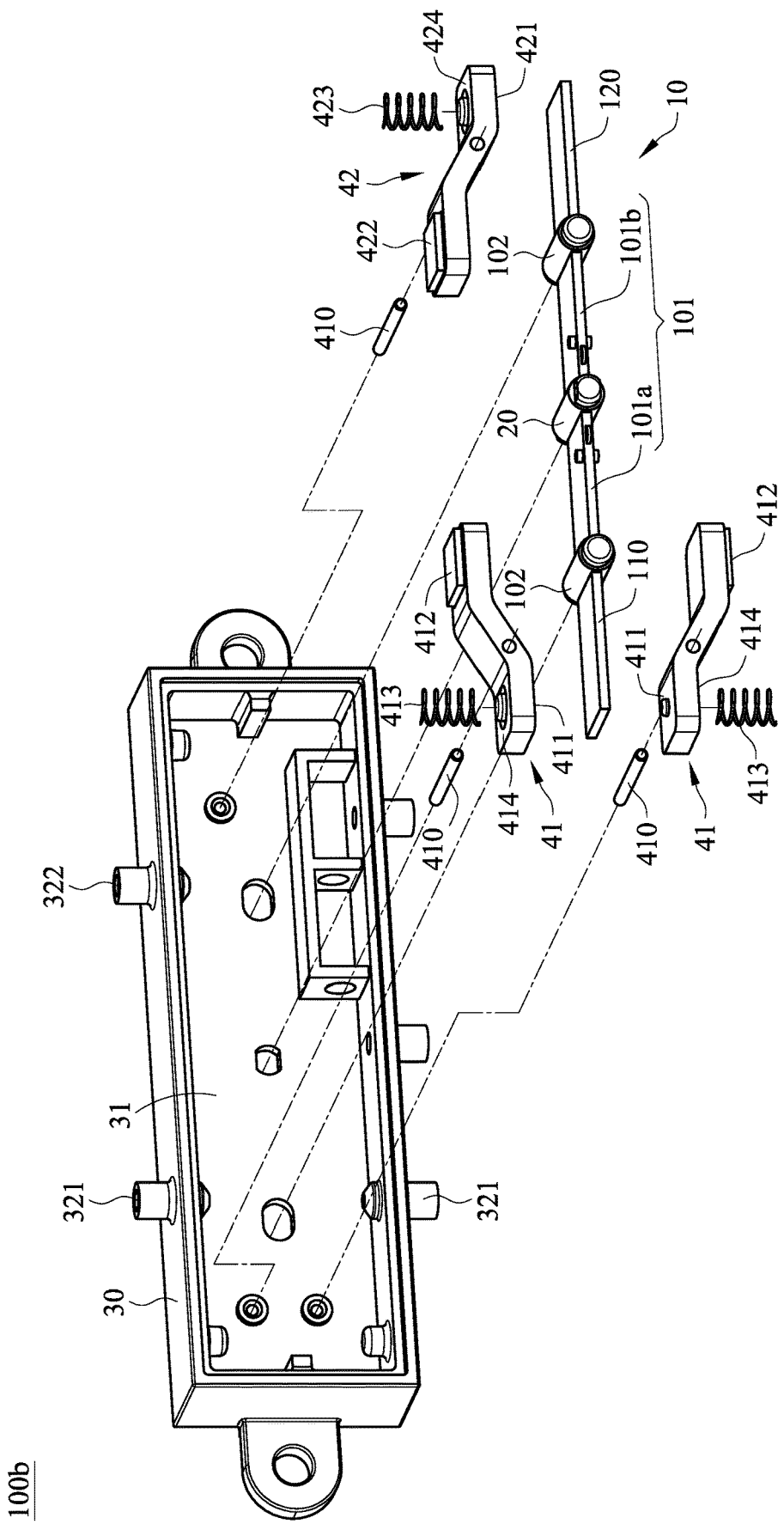
FIG. 8A is an exploded view of the actuating device according to the third embodiment of the invention, showing in particular the actuator and the stationary portion provided in the interior space of the housing.
Figure 8B:
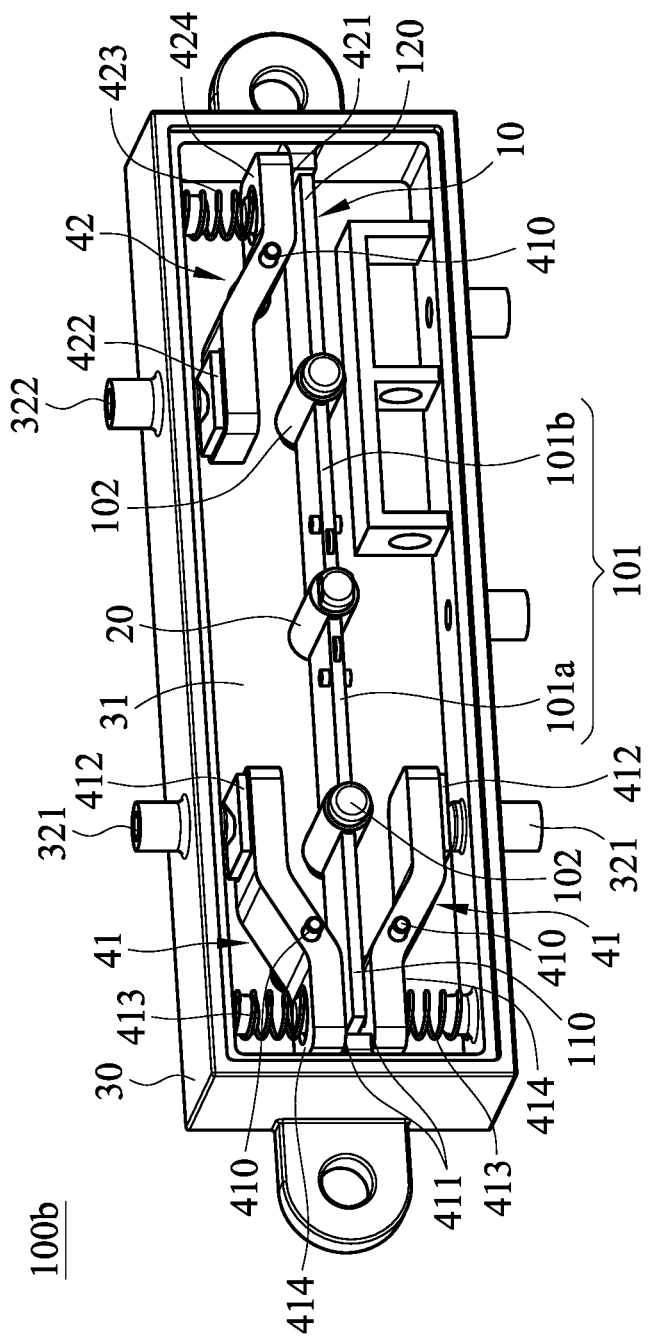
FIG. 8B is a perspective view of the actuating device according to the third embodiment of the invention, showing in particular the actuator and the stationary portion provided in the interior space of the housing.

Please refer to FIG. 7, FIG. 8A, and FIG. 8B respectively for a sectional view and a perspective view of the actuating device according to the third embodiment of the present invention, in which embodiment the actuator and the stationary portion are provided in the interior space of a housing. As shown in FIG. 7, FIG. 8A, and FIG. 8B, the actuating device 100b in this embodiment is different from the actuating device 100 in the first embodiment mainly in that the actuator 10 and the stationary portion 20 in the third embodiment are provided in an interior space 31 of a housing 30. The stationary portion 20 may be held in place by any connection/fixing method (e.g., by being locked in place with a bolt; by being fixed in place by soldering; by being hooked, and thus mechanically fastened, to the housing 30; or by being integrally formed with the housing 30 through a stamping process), provided that the stationary portion 20 is securely disposed in the interior space 31 of the housing 30 and allows the actuator 10 to exercise motion control freely in the interior space 31.

In this embodiment, with continued reference to FIG. 7, FIG. 8A, and FIG. 8B, the actuator 10 has at least one driving portion 101, the housing 30 is provided with at least one port 32 that extends into the interior space 31, and the driving portion 101 of the actuator 10 is configured to control the opening and closing of the port 32 independently.

The actuator 10 and the stationary portion 20 are designed to work together so that the actuating device of the present invention has wider application in various valve products than its prior art counterparts.

In this embodiment, with continued reference to FIG. 8A and FIG. 8B, the housing 30 is provided with two ports 32 that extend into the interior space 31, and the actuator 10 forms the first driving portion 101a and the second driving portion 101b as a result of the position of the stationary portion 20. The first driving portion 101a is configured to control the opening and closing of one of the ports 32 independently, and the second driving portion 101b is configured to control the opening and closing of the other port 32 independently.

The positions of the stationary portion 20 and of the actuator 10 in the present invention can be fine-tuned in order for the at least one driving portion to correspond in number to the at least one port 32 of the housing of a valve product, and for each port to be controlled by the corresponding driving portion, with each driving portion provided with the same or a different actuating ability.

According to the above, the actuating device of the present invention allows the stationary portion to be provided at an arbitrary position along the actuator in order to form the first driving portion and the second driving portion, and by adjusting the stationary portion in position to make a first length of the first driving portion and a second length of the second driving portion equal to or different from each other, the first driving portion and the second driving portion can be provided with the same actuating ability or each with a different actuating ability.

The first driving portion (101a) is an elongated member for providing a moment arm and has a first driving end (110). The second driving portion (101b) is also an elongate member for providing a moment arm and has a second driving end (120).

A first valve controller (41) hold in the housing (30) in a rotatable manner by a pin (410) and has: a first force-receiving end (411) having a side corresponding to the first driving end (110) in order for the first force-receiving end (411) to be driven by the first driving end (110); a first valve-controlling end (412) for controlling opening and closing of a first port (321) of the housing (30); and a first restoring spring (413) provided between an opposite side (414) of the first force-receiving end (411) and the housing (30).

A second valve controller (42) hold in the housing (30) in a rotatable manner by a pin (410) and has: a second force-receiving end (421) having a side corresponding to the second driving end (120) in order for the second force-receiving end (421) to be driven by the second driving end (120); a second valve-controlling end (422) for controlling opening and closing of a second port (322) of the housing (30); and a second restoring spring (423) provided between an opposite side (424) of the second force-receiving end (421) and the housing (30).

The above description is only the preferred embodiments of the present invention, and is not intended to limit the present invention in any form. Although the invention has been disclosed as above in the preferred embodiments, they are not intended to limit the invention. A person skilled in the relevant art will recognize that equivalent embodiment modified and varied as equivalent changes disclosed above can be used without parting from the scope of the technical solution of the present invention. All the simple modification, equivalent changes and modifications of the above embodiments according to the material contents of the invention shall be within the scope of the technical solution of the present invention.

What is claimed is:

1. An actuating device, comprising:
   an actuator having at least one driving portion;
   a stationary portion provided in a rectangular housing and at an arbitrary position along the actuator such that the driving portion forms a first driving portion on one side of the driving portion and a second driving portion on an opposite side of the driving portion, the actuating device being characterized in that by adjusting the stationary portion in position to make a first length of the first driving portion and a second length of the second driving portion equal to or different from each other, the first driving portion and the second driving portion are able to be provided with a same actuating ability or each with a different actuating ability;
   wherein the first driving portion is an elongated member for providing a moment arm and has a first driving end, and the second driving portion is also an elongate member for providing a moment arm and has a second driving end;
   a first valve controller held in the housing in a rotatable manner by a pin and having:
      a first force-receiving end having a side corresponding to the first driving end in order for the first force-receiving end to be driven by the first driving end;
      a first valve-controlling end for controlling opening and closing of a first port of the housing; and
      a first restoring spring provided between an opposite side of the first force-receiving end and the housing; and
   a second valve controller held in the housing in a rotatable manner by a pin and having:
      a second force-receiving end having a side corresponding to the second driving end in order for the second force-receiving end to be driven by the second driving end;
      a second valve-controlling end for controlling opening and closing of a second port of the housing; and
      a second restoring spring provided between an opposite side of the second force-receiving end and the housing.

2. The actuating device of claim 1, wherein the actuator is composed of at least one intelligent material selected from the group consisting of a memory metal, a thermoelectric material, a piezoelectric material, and a thermally deformable material.

3. The actuating device of claim 1, wherein the driving portion has at least one independently drivable electrode.

4. The actuating device of claim 1, wherein the first driving portion has at least one first electrode, and the second driving portion has at least one second electrode.

5. The actuating device of claim 4, wherein the first electrode and the second electrode are electrically isolated from each other.

6. The actuating device of claim 1, wherein the actuator has at least one supporting member.

7. The actuating device of claim 1, wherein the actuating device is applied to a valve product.

* * * * *